United States Patent [19]
Gruber et al.

[11] Patent Number: 5,306,866
[45] Date of Patent: Apr. 26, 1994

[54] MODULE FOR ELECTRONIC PACKAGE

[75] Inventors: Harald W. Gruber, Herrenberg; Heinz G. Horbach, Gechigen; Gunther W. Kötzle, Boeblingen; Thomas Ludwig, Sindelfingen; Helmut Schettler, Dettenhausen, all of Fed. Rep. of Germany

[73] Assignee: International Business Machines Corporation, Armonk, N.Y.

[21] Appl. No.: 867,953

[22] Filed: Apr. 13, 1992

[30] Foreign Application Priority Data

Jun. 6, 1991 [EP] European Pat. Off. ......... 91109299.7

[51] Int. Cl.$^5$ .............................................. H05K 7/20
[52] U.S. Cl. ................................. 174/15.1; 174/16.3; 174/252; 361/699
[58] Field of Search .................. 174/15.1, 16.3, 250, 174/252; 361/385

[56] References Cited

U.S. PATENT DOCUMENTS

| | | | |
|---|---|---|---|
| 4,047,198 | 9/1977 | Sekhon et al. | 357/82 |
| 4,381,032 | 4/1983 | Cutchaw | 361/385 X |
| 4,748,495 | 5/1988 | Kucharek | 357/82 |
| 4,833,567 | 5/1989 | Saaski et al. | 361/385 |
| 4,879,629 | 11/1989 | Tustaniwakyj | 361/385 |
| 4,893,590 | 1/1990 | Kashimura et al. | 174/15.1 X |
| 4,933,810 | 6/1990 | Cardashian et al. | 361/398 |
| 5,023,695 | 6/1991 | Umezawa et al. | 357/82 |

FOREIGN PATENT DOCUMENTS

| | | |
|---|---|---|
| 0009605 | 8/1979 | European Pat. Off. . |
| 0257119 | 8/1986 | European Pat. Off. . |
| 2938096 | 4/1981 | Fed. Rep. of Germany . |
| 2586510 | 2/1987 | France . |

OTHER PUBLICATIONS

IBM Technical Disclosure Bulletin vol. 20, No. 2, Jul. 1977, "Liquid Cooled Module with Compliant Membrane" by E. G. Loeffel, S. W. Nutter and A. W. Rzant.
Patent Abstract of Japan, vol. 9, No. 328 (E-369) (2051) 24 Dec. 1985, and JP-A-60 160 145 (Mitsubishi Denki K.K.) Aug. 21, 1985.

Primary Examiner—Morris H. Nimmo
Attorney, Agent, or Firm—Richard Lau

[57] ABSTRACT

A module containing an electronic package provides a housing for cooling and protecting the electronic package. A top metal shell and a bottom metal shell form a common cavity in which the package is embedded without touching the inner walls of the cavity. A flexible thermally conductive foil is fixed to each of the shells. The foil is adjustable to the surface of the package and is isolated from electrically conductive parts of the package. A cooling liquid fills the gaps between the metal shells and the foils. Flexible isolated circuit means connect the package to the outside of the housing, balancing means balance pressure and volume between the shells, and further means firmly hold together the housing.

11 Claims, 3 Drawing Sheets

MODULE FOR ELECTRONIC PACKAGE

FIELD OF THE INVENTION

This invention relates generally to a housing for an electronic package.

BACKGROUND OF THE INVENTION

Electronic packages generally include multilayer circuit boards or substrates with a large number of conductive and insulating layers formed thereon and an increasing number of semiconductor chips mounted on one surface of the multilayer board or substrate. The increased number of active elements per chip, although designed with reduced power dissipation, results in an increase in both the electrical power being consumed and the heat being produced. Improved cooling means for electronic packages are needed to keep the maximum temperature of the chips below their maximum operating temperature.

U.S. Pat. No. 4,879,629 discloses a liquid cooled integrated circuit module including a substrate and a plurality of chips mounted thereon. A compliant member, which is hermetically sealed at its perimeter to the substrate, completely seamless, overlies all of the chips. Between the compliant member and the chips, are thermally conductive studs carrying away the heat by conduction from the chips to the compliant member.

An integral heat pipe for transferring heat away from electronic components is described in U.S. Pat. No. 4,833,567. In a sealed chamber around the electronic components a thin film of liquid working fluid is in direct contact with the electronic components. The fluid absorbs the heat generated by the components, and transfers the heat away from the components by thin film evaporation of the liquid.

It is, however, desirable to prevent liquid contact with the chips since the liquid coolant causes stresses on discrete wiring and interior pressures. One possibility to overcome these problems is shown in IBM Technical Disclosure Bulletin Vol. 20, No. 2, July 1977. A plurality of heat sinks is molded into a flexible membrane so that each heat sink can be placed in contact with a chip to be cooled. The coolant transfers heat from the heat sinks to a finned-type cap by natural convection.

In order to obtain low thermal resistance between the object to be cooled and the coolant, good mechanical or physical contact with the object is important. One example where this is achieved is the flexible membrane described above that allows the heat sinks to conform to the chip surfaces for good conductive heat transfer.

To improve the effectiveness of cooling it is desirable to cool the top and bottom side of the module. This is realized in DE-A1-29-38-096 which describes a power semiconductor element arranged in a housing in a self-supporting way. Cooling pipes may be connected to external supply means provided at the top of the housing allowing a coolant to flow through the housing. The isolating coolant flowing through the housing cools the power semiconductor element arranged on a disk from both its sides.

SUMMARY OF THE INVENTION

It is an object of the present invention to provide an improved module for an electronic package which may be handled or replaced.

This object and further positive effects are achieved by the invention as claimed.

A module containing an electronic package provides a housing for cooling and protecting the electronic package. The housing comprises two metal shells, a top and a bottom shell, which form a common cavity in which the package is completely embedded without touching the inner walls of the cavity. A flexible thermally conductive foil is fixed to the periphery of each of the shells. The foil is adjustable to the surface of the package. It is isolated from electrically conductive parts of the package. The adjustable foil directly contacts the electronic elements like semiconductor chips mounted on a substrate embedded in the module. The heat produced by the electronic elements during operation is immediately lead away by the thermally conductive foil being in close contact to these electronic elements. Thus an improved cooling of the electronic package is achieved with the thermal resistance being extremely low.

A cooling liquid fills the gap between the metal shell and the respective foil. Once the cooling liquid being filled in the cavity is hermetically sealed. The cooling liquid may not escape from the cavity and there is no need of external supply means allowing coolant to flow through the package. Therefore a very compact module is provided which due to the lack of external supply means is handled, transported and, if necessary, replaced in an electronic system very easily.

Flexible isolated circuit means connect the package to the outside of the housing, balancing means assure the balancing of pressure and volume between the shells, and further means firmly hold together the housing.

The electronic package is embedded in the cavity without touching the inner walls in a self-supporting way. It may change its position within the module in accordance to the pressure between the two metal shells.

Thus, besides their thermal advantages, the fluid cushions in the gap between the metal shell and the respective foil prevent mechanical stresses caused by mismatch of expansion coefficients or conflicting design and manufacturing tolerances. They also act as damping elements against shocks and vibrations.

These properties allow the modules to be used in areas where vibrations and shocks are to be expected and makes them especially useful for automotive industry applications. There, high density chips are needed which produce a lot of heat to be lead away without having much room for traditional air or water cooling elements. With the fluid cushions acting as damping elements a compact, stress-resistant module is provided which may easily be handled or exchanged due to the lack of external supply means.

BRIEF DESCRIPTION OF THE DRAWINGS

Ways of carrying out the invention are described in detail below with reference to drawings showing only specific embodiments in which.

DETAILED DESCRIPTION OF THE PREFERRED EMBODIMENTS

Figure 1:
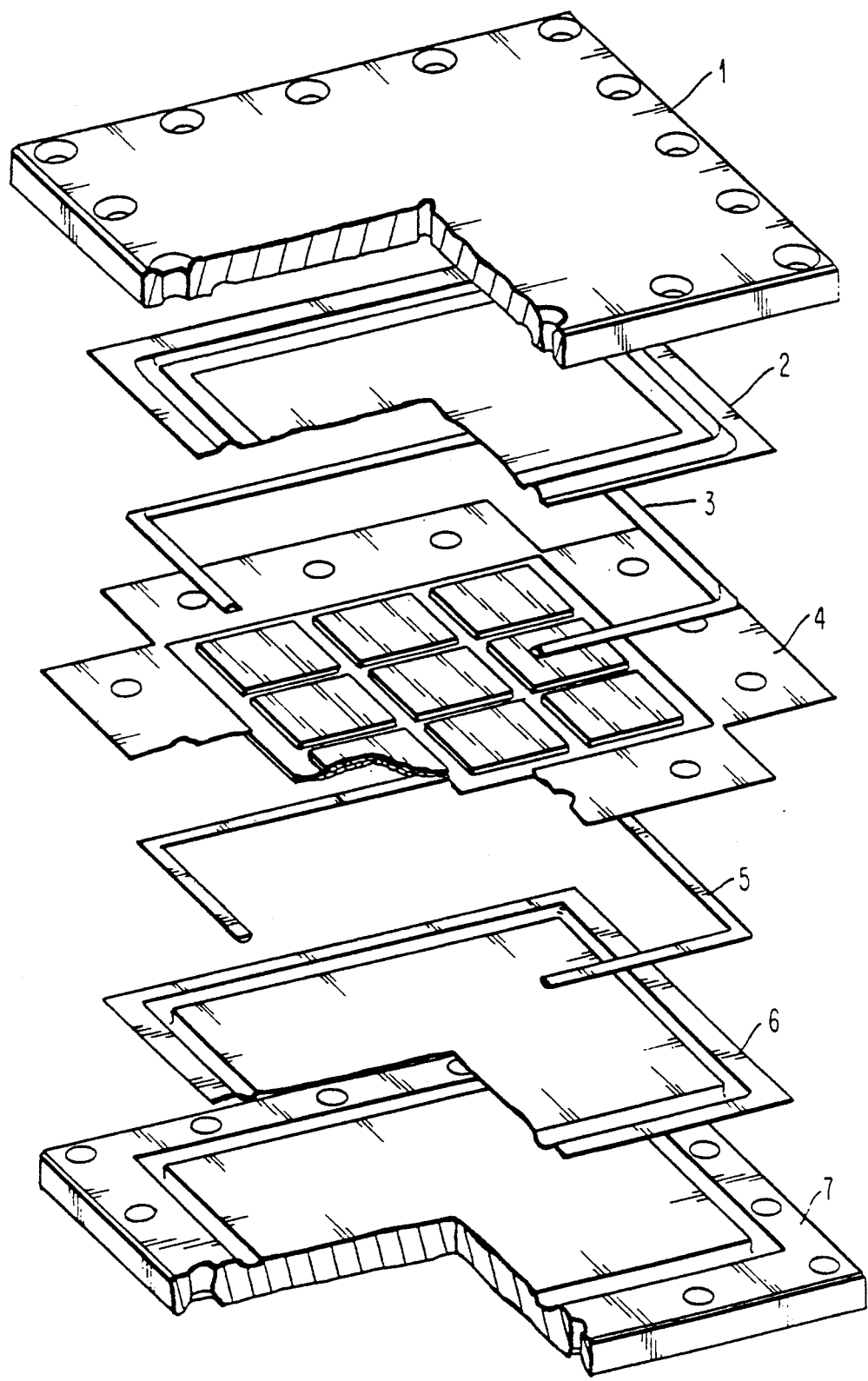
FIG. 1 shows an exploded view of the module with its different parts.

The exploded view of the module in FIG. 1 contains the following parts needed for the module assembly: top and bottom metal shells 1,7; foils 2,6 to be fixed to top shell 1 or bottom shell 7; upper and lower balancing means 3,5; and electronic package 4.

Figure 2:
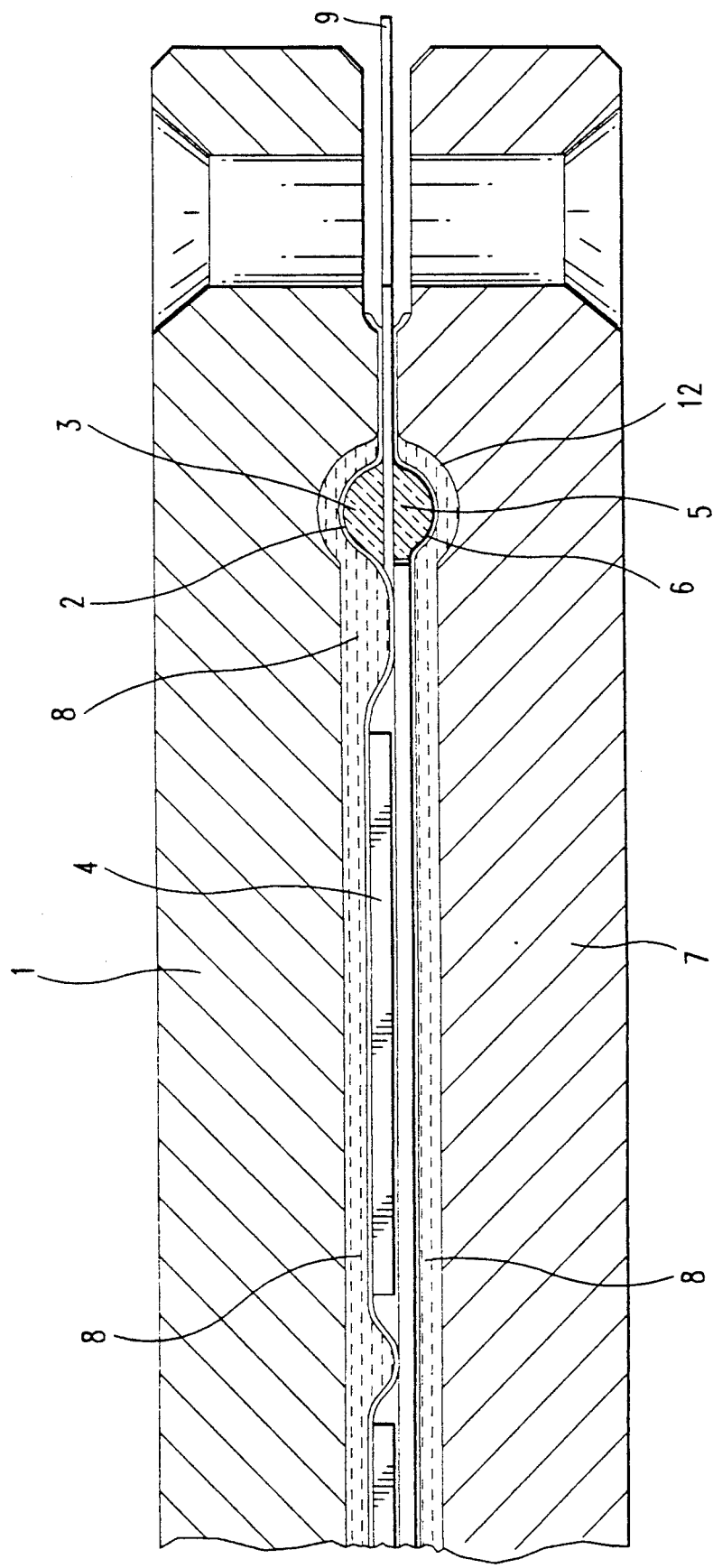
FIG. 2 is a cross-sectional view of the assembled module with the cooling liquid.

The top metal shell 1 and the bottom metal shell 7 both have a flat cavity. When assembled, they form a common cavity in which the electronic package 4 is completely embedded without contacting the inner walls of the cavity as can be seen in FIG. 2. This metallic encapsulation guarantees excellent magnetic shield of the embedded electronic package 4. Therefore, with this encapsulation, no electro-magnetic interference problems will arise.

The electronic package 4 comprises a multilayer substrate containing a large number of conductive and insulating layers or a ceramic or glass-ceramic substrate with semiconductor chips mounted thereon. In a preferred embodiment it is a silicon-on-silicon package consisting of silicon chips mounted on a thin silicon carrier. In this preferred embodiment, due to the same heat emission characteristic and the same thermal expansion, the highest cooling efficiency without mechanical stresses within the electronic package is obtained.

The foils 2,6 are firmly attached to the periphery of the shells 1,7 such that the inner part of the foil area easily bends towards the electronic package 4. The foils 2,6 may be fixed by soldering or bonding. They are flexible and therefore self adjusting to the surfaces of the electronic package 4 such that they are in close contact to these surfaces which are the surfaces of the electronic elements to be cooled. The foils 2,6 are made of thermally conductive material, preferably of metal. In a preferred embodiment the foil is a thin copper foil with a thickness of about 12 um. The foils 2,6 are isolated from electrically conductive parts of the package 4. This may be achieved by a liquid resin spun on the foils 2,6 and hardened or by a thin isolating film glued to one side of each of the foils 2,6.

The electronic package 4 is connected to the outside, such as to an external component (not shown), by flexible isolated circuit means 9. These circuit means 9 may be four flexible circuits which have to be isolated on both sides. This isolation may also be achieved by the balancing means 3,5 made of isolating material and lying between the flexible foils 2,6 and the circuit means 9 in a way that there remains no contacting area between the foils 2,6 and the circuit means 9 as can be seen in FIG. 2. The balancing means 3,5 assure the balancing of pressure and volume between the two shells 1,7 after these have been filled with cooling liquid 8, especially when the cooling liquid 8 expands due to thermal effects. Therefore they must be made of highly extensible, non-aging material which is stable to temperature changes. These balancing means 3,5 may be 2 rings of elastic material like silicon rubber. Each ring is provided at the periphery of the package substrate or package layer between the top foil 2 or bottom foil 6 and the package 4. In a specific embodiment shown in FIG. 2, the top and bottom shells 1,7 and the respective foils 2,6 each have a groove 12 at their periphery for incorporating the rings 3,5. All the parts are assembled and firmly secured by appropriate securing means, such as screws or rivets.

The top and bottom shell 1,7 are then simultaneously filled with a thermally conductive cooling liquid via filling ports. The cooling liquid 8 fills the gaps between the metal shells 1,7 and the foils 2,6, and comprises, e.g., silicone oil. Under the pressure of the fluid 8, the flexible and thermally conductive foils 2,6 completely enclose the surfaces of the electronic package 4, as shown in FIG. 2, thus providing an optimum heat transition path from the package 4 to the cooling liquid 8 and thereby increasing the heat transfer efficiency. The electronic package 4, completely enclosed by the flexible foils 2,6, is not fixed within the cavity as can be seen in FIG. 2. Within the sealed cavity it may find its best position.

Figure 3:
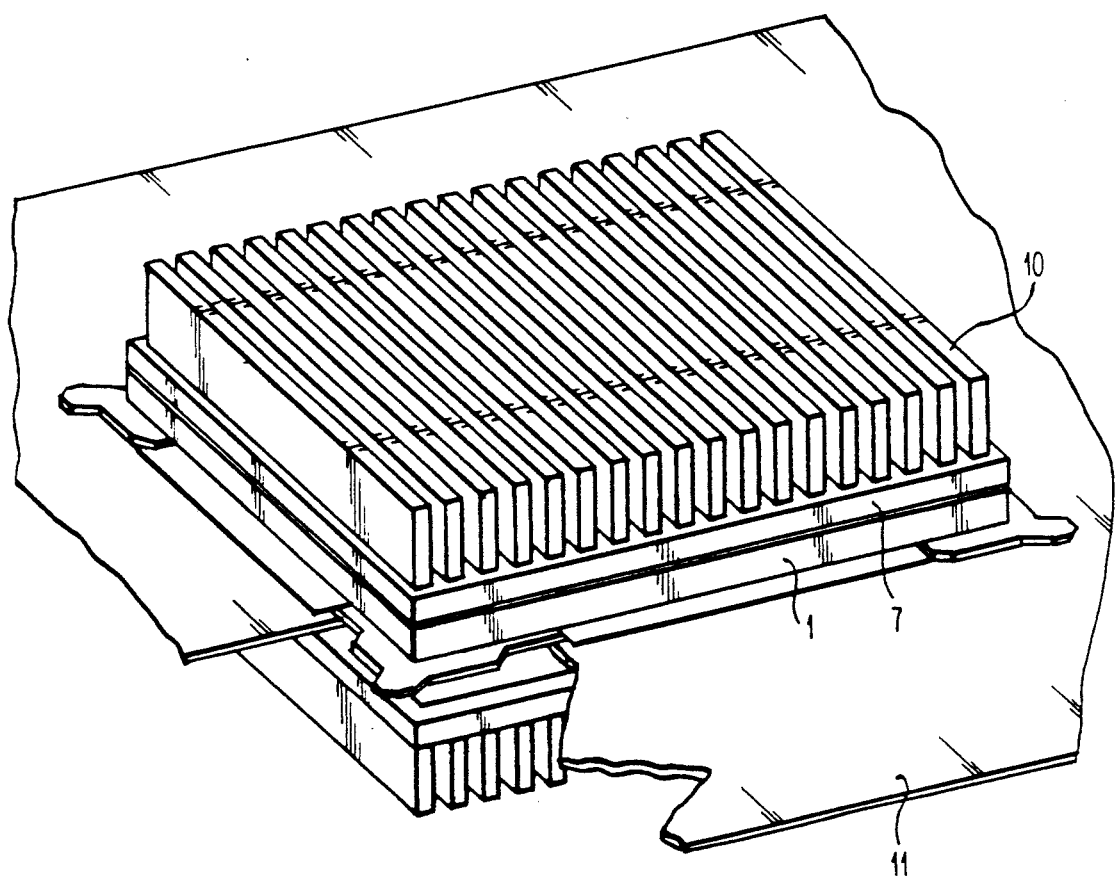
FIG. 3 shows the module of FIG. 2 inserted into a board and with additional finned heat sinks.

FIG. 3 shows a board 11 containing an opening greater than the circumference of the module. The module is inserted in the opening, and is fixed to the four corners of the opening by flexible fixing means, such that a slit remains between the four sides of the module and the board. The top metal shell 1 of the inserted module projects from one side, and the bottom metal shell 7 projects from the opposite side of the board 11.

Due to this slit surrounding the module, air streaming between board and module leads to an additional cooling of the module. The cooling effect may be further improved with additional finned heat sinks 10 or other known cooling means attached to the top and/or bottom of the module. The heat sinks 10 may be air or water cooled.

While the invention has been described in terms of specific embodiments, it is evident in view of the foregoing description that numerous alternatives, modifications and variations will be apparent to those skilled in the art. Thus, the invention is intended to encompass all such alternatives, modifications and variations which fall within the scope and spirit of the invention and the appended claims.

What is claimed is:

1. A module for providing a housing for an electronic conductive parts, comprising:
   a top metal shell;
   a bottom metal shell being assembled with said top metal shell and forming a cavity with said top metal shell for embedding said package therein, said cavity having inner walls, and said package making no contact with the inner walls of said cavity;
   a plurality of flexible thermally conductive foils disposed in said cavity and being adjustable for said package, and being isolated from the electrical conductive parts of said package upon installation;
   a cooling liquid disposed between said metal shells and said foils;
   circuit means for connecting said package to a component external of said module; and
   balancing means for balancing pressure and volume between said shells.

2. A module according to claim 1, wherein each of said top and bottom metal shells has a flat cavity.

3. A module according to claim 1, wherein said package is enclosed by said flexible thermally conductive foils.

4. A module according to claim 1, wherein said flexible thermally conductive foils are fixed to said shells by soldering or bonding.

5. A module according to claim 1, wherein said flexible thermally conductive foils comprise a metal foil.

6. A module according to claim 1, wherein said circuit means comprises a flexible circuit.

7. A module according to claim 1, wherein said balancing means comprises two rings of elastic material provided between the foils and the package.

8. A module according to claim 1, wherein said cooling liquid comprises silicone oil.

9. A module according to claim 1 adapted for being fixed to a board, aid board having at least one opening of a size appropriate for allowing the module to be inserted therethrough, said module adapted for being fixed to said board such that said top metal shell projects from one side, and said bottom metal shell projects from the opposite side of said board; and said circuit means adapted for being electrically connected to wiring included with said board.

10. A module according to claim 9, further comprising an electronic system adapted for having said board fixed therein and electrically connected thereto.

11. A module according to claim 10, wherein said electronic system comprises a data processing system.

* * * * *